(12) United States Patent
Kwark

(10) Patent No.: US 7,215,133 B2
(45) Date of Patent: May 8, 2007

(54) CONTACTLESS CIRCUIT TESTING FOR ADAPTIVE WAFER PROCESSING

(75) Inventor: Young Hoon Kwark, Chappaqua, NY (US)

(73) Assignee: International Business Machines Corporation, Armonk, NY (US)

( * ) Notice: Subject to any disclaimer, the term of this patent is extended or adjusted under 35 U.S.C. 154(b) by 51 days.

(21) Appl. No.: 10/769,115

(22) Filed: Jan. 30, 2004

(65) Prior Publication Data
US 2005/0168234 A1 Aug. 4, 2005

(51) Int. Cl.
G01R 31/36 (2006.01)
G01R 31/02 (2006.01)
G01R 31/28 (2006.01)

(52) U.S. Cl. .............. 324/765; 324/753; 324/158.1; 324/763; 714/733; 714/734

(58) Field of Classification Search ................ 324/765
See application file for complete search history.

(56) References Cited

U.S. PATENT DOCUMENTS

| 4,697,183 A * | 9/1987 | Jenning et al. ........ 340/870.25 |
| 4,827,212 A * | 5/1989 | Kamieniecki ............... 324/765 |
| 5,583,445 A * | 12/1996 | Mullen ...................... 324/753 |
| 6,331,782 B1 * | 12/2001 | White et al. ................ 324/763 |
| 6,556,029 B1 * | 4/2003 | Min et al. ................... 324/751 |
| 6,686,760 B2 * | 2/2004 | Hirt ........................... 324/765 |
| 6,759,863 B2 * | 7/2004 | Moore ........................ 324/765 |
| 6,787,801 B2 * | 9/2004 | Fischer et al. ............... 327/48 |
| 6,815,973 B1 * | 11/2004 | Conn ......................... 324/765 |
| 6,885,202 B2 * | 4/2005 | Slupsky ...................... 324/753 |
| 6,906,495 B2 * | 6/2005 | Cheng et al. ............... 320/108 |
| 6,976,234 B2 * | 12/2005 | Kasapi .......................... 716/6 |
| 2001/0043078 A1 * | 11/2001 | Kantz et al. ................ 324/765 |
| 2002/0047722 A1 * | 4/2002 | Cook et al. ................. 324/765 |
| 2003/0146771 A1 * | 8/2003 | Moore ........................ 324/765 |
| 2004/0046585 A1 * | 3/2004 | Kamieniecki et al. ...... 324/765 |
| 2005/0138499 A1 * | 6/2005 | Pileggi et al. .............. 714/724 |

\* cited by examiner

Primary Examiner—Ha Tran Nguyen
Assistant Examiner—Emily Y Chan
(74) Attorney, Agent, or Firm—Keusey, Tutunjian & Bitetto, P.C.; Anne V. Dougherty, Esq.

(57) ABSTRACT

A system and method for measuring circuits on an integrated circuit substrate includes a measurement circuit formed on the integrated circuit substrate that measures at least one characteristic of an integrated circuit. The measurement circuit has a power transfer device including a power transfer component, which receives energy from a source where the source does not make physical contact with the integrated circuit substrate to transfer power to the measurement circuit. Measurements are taken to provide feedback for in-situ adjustments to circuit parameters and responses.

10 Claims, 4 Drawing Sheets

CONTACTLESS CIRCUIT TESTING FOR ADAPTIVE WAFER PROCESSING

BACKGROUND

1. Technical Field

Exemplary embodiments of the present disclosure relate to circuit testing, and more particularly to a system and method for contactless testing of wafers that are undergoing semiconductor processing.

2. Description of the Related Art

It is desirable, in semiconductor processes, to be able to measure or have some indication of how close a parameter is to a target value when a fabrication process is completed. However, many aspects of semiconductor fabrication do not yet offer control over the absolute values of key parameters. It is this lack of control that has forced circuit designers to turn to ratio techniques that take advantage of the local tracking of parameters, which, in contrast, are tightly controlled, in this processing environment.

SUMMARY

A systematic method is needed to measure key process parameters as manifested in circuit parameters in a fashion that does not represent a significant overhead in terms of wafer real estate, is compatible with the type of equipment that could be installed in a wafer fabrication line, and does not contact the wafers so that the wafers can continue through the remainder of the process flow without any concerns about contamination.

A system and method for measuring circuits on an integrated circuit substrate include a measurement circuit formed on the integrated circuit substrate that measures at least one characteristic of the integrated circuit. The measurement circuit has a power transfer device including a power transfer component, which receives energy from a source where the source does not make physical contact with the integrated circuit substrate to transfer power to the measurement circuit. Measurements are taken to provide feedback for in-situ adjustments to circuit parameters and responses.

These and other objects, features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

Figure 1:
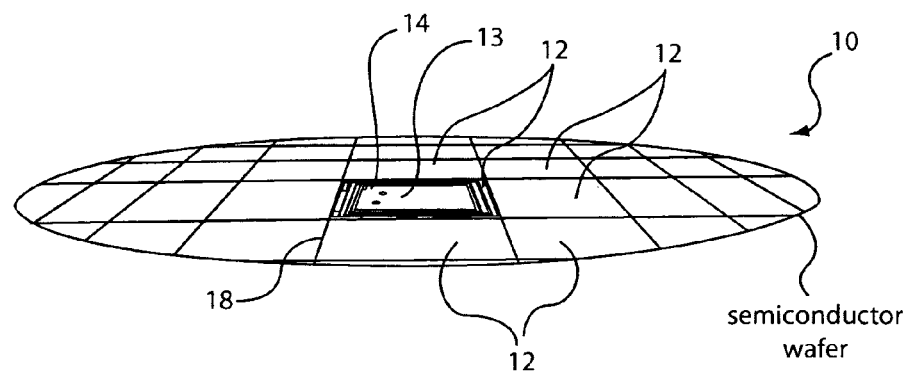
FIG. 1 is a perspective view of a semiconductor wafer that includes a measurement circuit in accordance with one embodiment.

Exemplary embodiments measure key process parameters manifested as circuit performance in a contactless manner. These measurements may be particularly useful in a semiconductor fabrication process if they are made at a sufficiently early point in the process flow. In this way, the measurement information may be used to "adaptively" alter the subsequent steps in wafer fabrication to compensate for any measured discrepancies between measured and desired wafer parametrics.

In one example, a class of circuits utilizes voltage-controlled oscillators (VCOs) whose center frequency is set by the product of an inductance and a capacitance. The frequency is usually tuned by varying the capacitance of a voltage tuned capacitor (e.g., a varactor), but as the tuning range is limited, there is a risk that the center frequency may be sufficiently off-target and the needed tuning range cannot be covered by the circuit. In such a case, if the capacitance of the varactor can be measured before all the wiring is completed in the process, then the inductance could be varied by, e.g., tapping the inductor coil at a suitable point to achieve the desired LC product. Alternatively, fewer or additional varactors could be wired in parallel by selecting from different configurations of wiring realized in subsequent metal levels to achieve the desired total capacitance ($C_{total}$).

This measurement could be made by physically probing a test site, however, due to particulate issues, it is usually undesirable to continue processing on a wafer that has been contaminated in such a fashion. Additionally, conventional probing requires pad real estate, which represents considerable overhead in chip real estate. Usually such a test wafer may be scrapped, and would represent an overhead in the process. Since the value of wafers that have reached a point in the processing sufficient to permit this type of testing is considerable, this option incurs a cost penalty. Also, if the wafer-to-wafer variations in the process are significant (usually, these are much worse than on-wafer variations), then there is an additional error term that arises from this sampling process.

In particularly useful embodiments, the data from in-situ measurements could be fed into a database, and analyzed so that adaptations could be made to either downstream process parameters or to select from one of a set of mask plate combinations that would implement wiring changes that effect the compensation desired. This procedure could be seamlessly incorporated into the control flow of a fabrication plant with minimal additional cost. The largest cost may be represented by additional mask plates that represent possible process options. In addition, if it is found that the parameters are beyond recovery, the wafers can also be scrapped at an earlier point in the process, thereby saving the expense of further processing on wafers that eventually would be scrapped.

The contactless measurement system may be employed during or after a process step. In this way, measurement feedback can be determined quickly so that appropriate steps can be taken.

Figure 2:
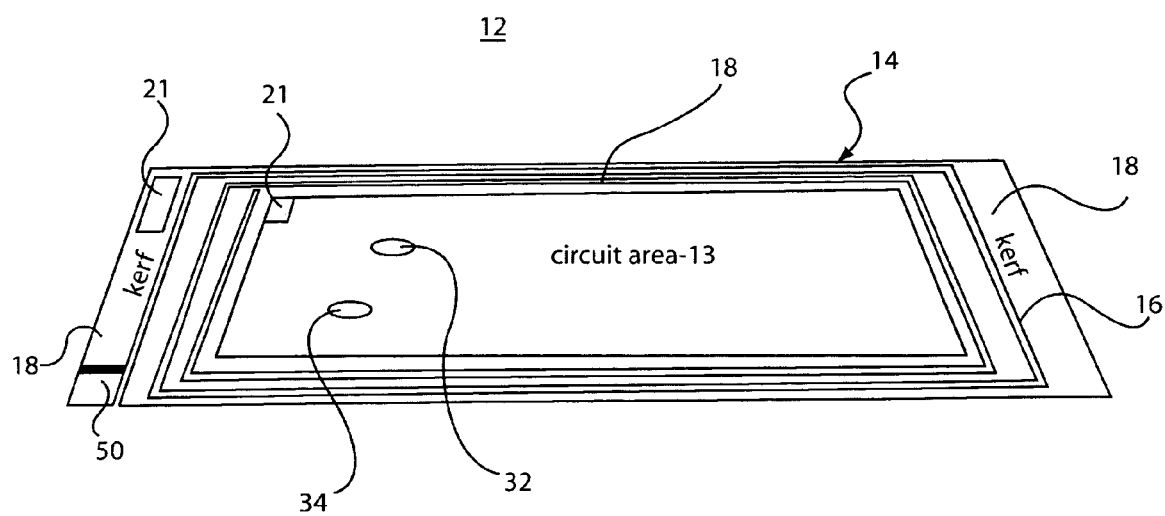
FIG. 2 is a perspective view of a semiconductor chip that includes a measurement circuit having an inductive and an optical contactless power transfer method in accordance with exemplary embodiments of the present invention.

Referring now in detail to the figures in which like numerals represent the same or similar elements and initially to FIGS. 1 and 2, a semiconductor wafer 10 is shown which includes one or more integrated circuit chips 12 formed thereon. At least one chip 12 includes a measurement circuit 14 in accordance with one illustrative embodiment. Measurement circuit 14 includes components which mirror the behavior of key process parameters experienced by the circuits 13 embedded in the integrated circuit chip 12.

To test a circuit 14 formed on the semiconductor wafer 10, electrical power may be needed to power active devices, and a means to manipulate control signals and to extract information from the circuit to obtain desired information about its performance are needed. Advantageously, this is done without physically contacting the wafer.

A plurality of different methods may be employed to supply power to circuit 14. FIG. 2 illustrates two methods for coupling electrical power into circuit 14 to conduct measurements on the wafer 10. One method uses a spiral inductor 16 composed of wiring that is preferably placed in a kerf region 18 between circuit die. This area 18 is usually dedicated to process monitor sites and represents wasted space since a saw blade kerf consumes this area. Therefore, placing a spiral inductor 16 in this region will not adversely impact die yield per wafer. It is noted that other regions of wafer 10 or chip 12 may also be employed to form spiral inductor 16. Spiral inductor 16 is used to form a secondary coil of a transformer.

Figure 3A:
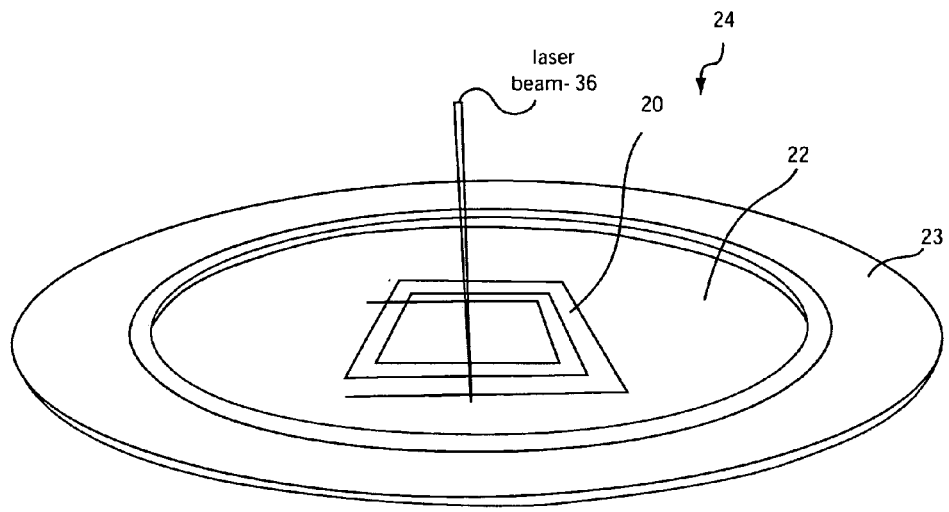
FIG. 3A is a perspective view of a probe disk having a transparent membrane, which supports an inductor coil and permits light to pass therethrough to power the measurement circuit in accordance with the embodiment of FIG. 2.
Figure 3B:
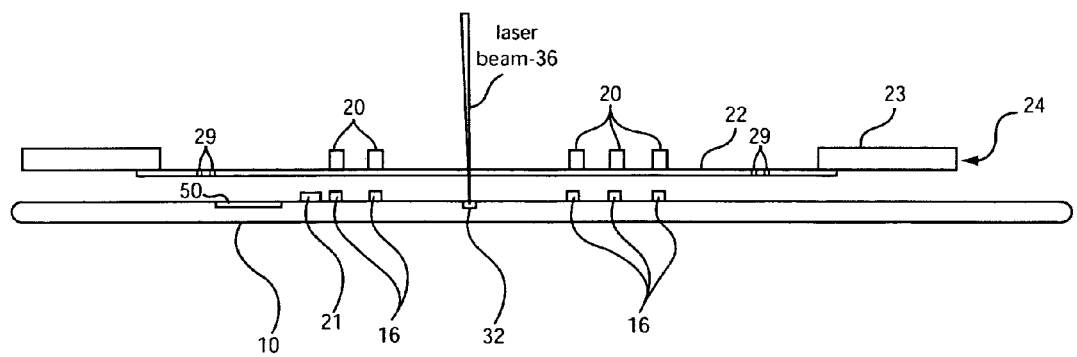
FIG. 3B is a side view of the probe disk of FIG. 3A and a semiconductor device disposed in an operative relationship to permit power transfer by either or both of inductive coupling or optical coupling to the measurement circuit.

Referring to FIGS. 3A and 3B with continued reference to FIG. 2, a primary coil 20 may be located on a membrane 22 that is part of a wafer test station 24. The membrane 22, is preferably transparent to facilitate alignment of the coils 20 and 16. A probe ring 23 supports membrane 22. Membrane 22 preferably includes a thin film dielectric material, such as a polymer or an oxide, such as silicon dioxide. A representative membrane 22, as illustratively shown in FIG. 3B, is placed in close proximity without contact with the wafer 10 to enhance the coupling coefficient between the coils of this transformer (formed from coils 20 and 16), but no physical contact need be made with the wafer 10. The inductance of the coils can be resonated against capacitors to increase the efficacy of the power transfer.

Referring again to FIG. 2 with continued reference to FIGS. 3A and 3B, an alternate method of providing power to the circuit under test may include photodiodes 32 and 34 (FIG. 2), preferably integrally formed on the chip 12. These may also be located in the kerf region 18, or in the active circuit region 13 if space is available (FIG. 2). There may be several junctions present in the semiconductor process that can be utilized for photovoltaic power generation. Optical power may be coupled to the wafer via a focused beam or similar collimated source 36 such as a laser of appropriate wavelength. The membrane 22 is then preferably transparent at the wavelength used. Lasers are particularly suited as a power transfer means due to the high power densities they can provide. A photo-sensitive device 32, such as a photodiode, may be employed to receive energy from source 36 to power circuit 14.

Photodiodes 32 and 34 are illustratively shown as devices that can also convey control information to the circuit 14. These photodiodes 32 and 34 can be used in a variety of modes, for example, as current sources, as voltage sources, or as variable resistors depending upon the design of the photodiode, the intensity of the illumination and impedance of the node the photodiode is attached to.

Control circuits 21 which may be connected to the photodiodes 32 and 34 may be included in the kerf region 18 or in active regions 13 of the chip 12. These control circuits can be used to affect control over circuit 14 for testing purposes.

Figure 4A:
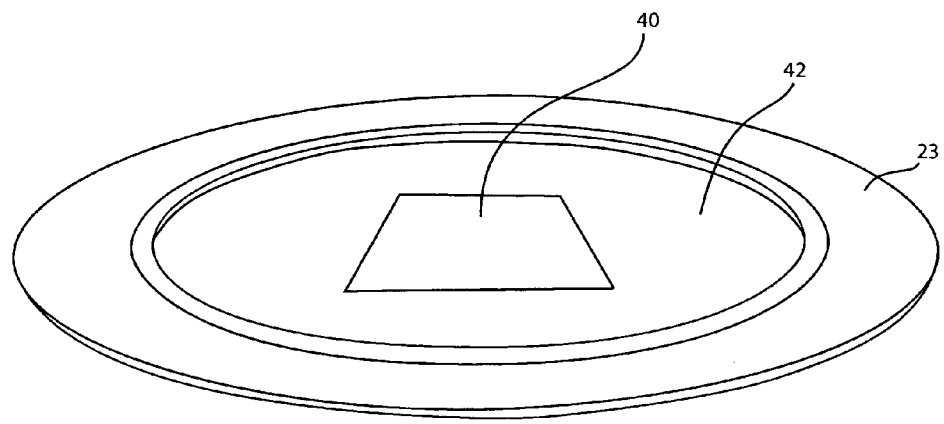
FIG. 4A is a perspective view of a probe disk having a transparent membrane, which supports a capacitor plate to power a measurement circuit by capacitive coupling.
Figure 4B:
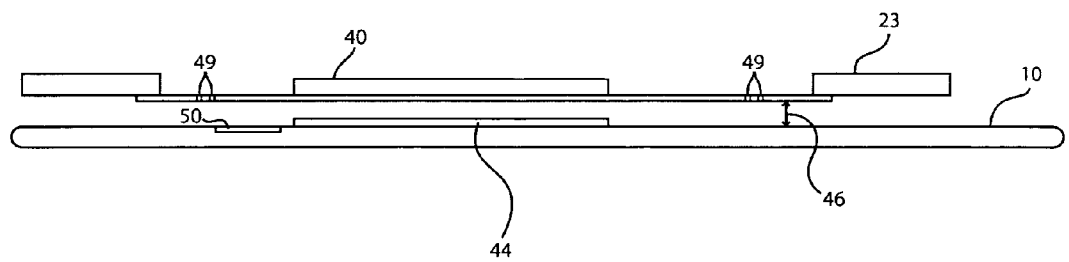
FIG. 4B is a side view of the probe disk of FIG. 4A and a semiconductor device disposed in an operative relationship to permit power transfer by capacitive coupling to the measurement circuit.

Referring to FIGS. 4A and 4B, capacitive coupling between conductive pads may alternately be employed as a method for transferring power and/or making measurements. One pad 40 may be located on a probe membrane 42 and another pad or pads 44 may be located on semiconductor wafer 10. The membrane 42 may be transparent as before to facilitate alignment between pads 40 and 44. A gap 46 is preferably maintained at a small enough distance to obtain useful values for coupling capacitance. The small gaps depicted in FIGS. 3B and 4B may be maintained by an air bearing formed by a controlled bleed of purified air being fed into holes 29 (FIG. 3B) and 49 (FIG. 4B). Alternatively, precision mechanical staging can be used to establish and maintain a small separation between the probe card membrane 22 and 42 and the surface of the wafer 10.

Regardless of the power coupling method used (e.g., induction/transformer, light source, capacitive coupling), a power conditioning circuit 50 will be needed to convert the power into a voltage/current level that is useful for powering the circuit 14. In many cases, on-chip capacitance may be present to provide power supply decoupling. In that case, the power conditioning circuit 50 may include a charge pump to condition the input power and charge a capacitive reservoir. In this scenario, a pulsed testing technique could be used which would reduce the amount of power transfer that is needed across either the coil or photodiode power link. In the pulsed technique, the power transfer process continues as long as needed to charge up a capacitor bank, which could reside in the power conditioning circuit 50 or be incorporated as decoupling in the circuit 13. The power transfer process may be interrupted during the circuit test phase to reduce problems with interference from the power transfer process that may compromise circuit operation.

In addition to power, much greater control over circuit testing can be gained if the ability to control the state of various signals within the circuit (usually low speed control lines) is present. Some circuits will not need this capability, but for those that do need it, there are several alternate techniques that can be used to effect control. For example, photodiodes 32 and 34 in FIG. 2 may be employed to convey control information to and from the circuit 14 via the control circuit 21.

If the particular application process is not amenable to such a control mode, then radio frequency (RF) coupling of a signal can be used by, for example, adding additional coils which can be wound in proximity of the main power coupling coil 16 (e.g., FIG. 2). These additional coils can be resonated to separate frequencies so that multi-channel operation is possible and to avoid interference from the power coupling frequency.

In another embodiment, capacitive proximity coupling (FIGS. 4A and 4B) may be employed in which a metallic plate could be positioned over a specific area of the circuit to capacitively couple control signals into the circuit 14. Advantageously, no physical contact is needed to effect control for any of these methods.

The circuit 14 conveys information externally from the chip 12 (to the outside world) as to its state of operation. In some cases, the nature of the circuit itself makes it amenable to straightforward contactless monitoring. For example, in the case of an oscillator, sufficient RF energy may emanate from the circuit to permit an external antenna/tuned filter/LNA etc. to feed into a spectrum analyzer. The spectrum analyzer may determine frequency, phase noise, harmonic content, or a plurality of other parameters. These parameters are then used as measurements to ascertain performance of the circuit.

If monitoring the RF energy is not sufficient to verify circuit operation, it may be possible to use the power-coupling coil 16 (FIG. 2) to transmit some low bandwidth information. This can be accomplished by superposing a higher frequency trace signal on the larger amplitude, lower frequency power signal. Alternatively, a signal can be capacitively coupled as depicted in FIGS. 4A and 4B.

The degree of complexity that can be accommodated during the circuit test phase depends upon the degree to which the processing of the wafer has been completed. Waiting until later in the process to do this testing will allow for more testing options, but will reduce the number of "corrective" actions that can be taken to remedy process deficiencies. These factors need to be weighed to achieve optimal results, for example, lower overhead versus cost of reduced yield.

There may be circuits that permit far simpler determinations of component parameters. For example, in the case of a VCO where it is desired to determine the zero bias capacitance of a varactor, a test varactor can be resonated against an inductor made in a lower level metal. This "tank" circuit will have lower Q due to the lower Q of the inductor, but measurement of the resonant frequency will still permit determination of the capacitance. This resonant frequency can be determined by using a coil in the test probe membrane to couple RF energy into the test tank circuit. Looking at the impedance reflected into the coil on the test probe card from the tank circuit will permit determination of this frequency. In this case, the issues of powering the circuit and controlling it are irrelevant. In a further extension, if a resistance is placed in parallel with this tank circuit, measurement of the "Q" of this tank circuit can yield the measurement of a resistance.

Once the circuit parameters have been determined using one of the techniques above, the changes that need to be enacted in subsequent process steps can take one of several different forms. One of the simplest steps would be a tweak of a process parameter, e.g., the thickness of a metal layer, or resistivity of a thin film sheet resistor. Other actions may include using the test information to select from an option of different mask plates that would effect changes in circuit connectivity. For example if the capacitance of a varactor were deemed to be off center, then the mask that implements the final inductor with which it resonates could be chosen from a selection of different inductances. Alternatively additional trim varactors could be wired in by a later metal step to achieve the desired capacitance.

Figure 5:
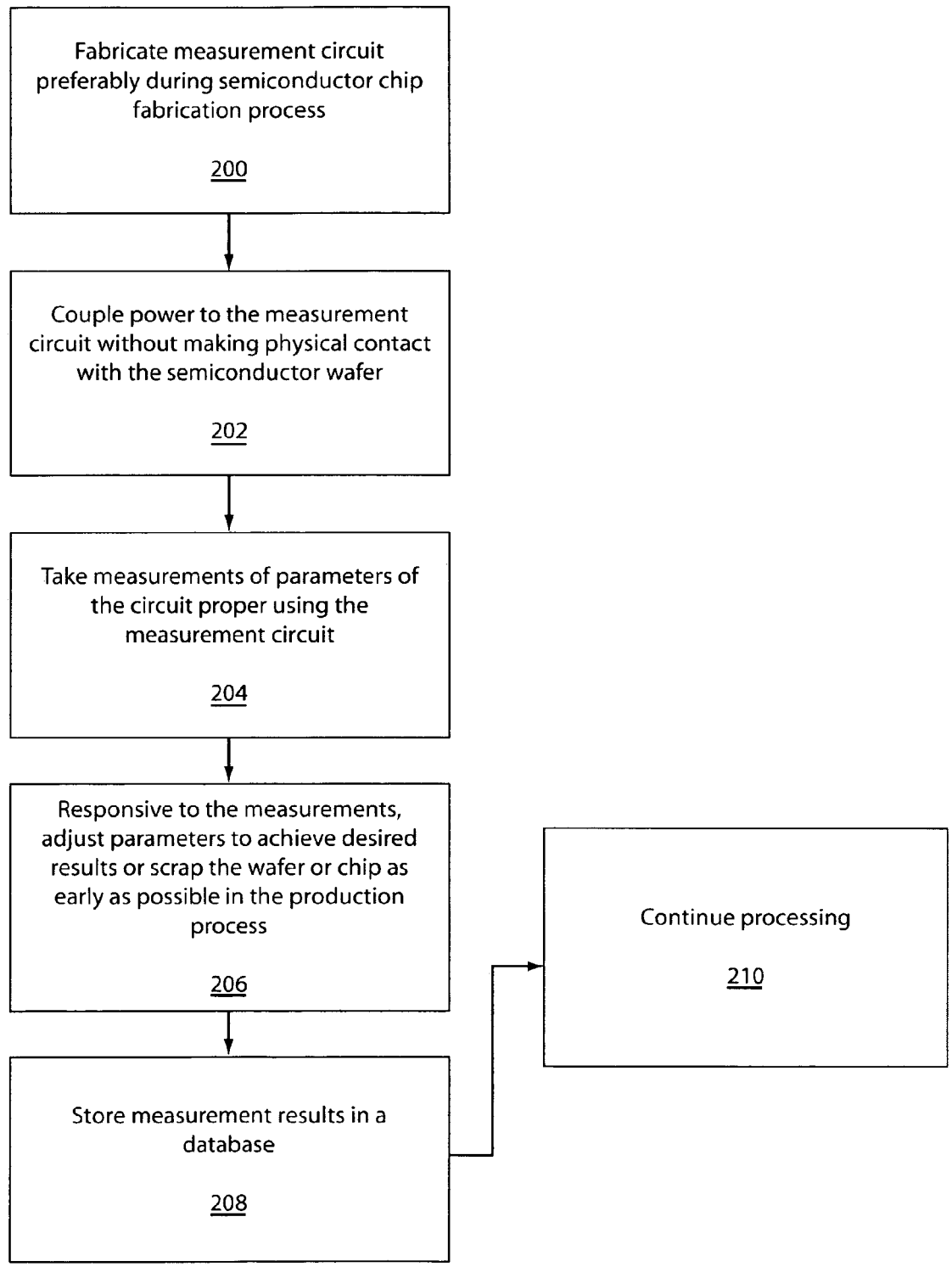
FIG. 5 is a block/flow diagram showing a system/method for taking measurements of a circuit during processing by employing a measurement circuit powered by a source, which couples energy to the measurement circuit by a contactless method.

Referring to FIG. 5, a method for implementing a contactless test will now be illustratively described for exemplary embodiments. It should be understood that the elements shown in FIG. 5 may be implemented in various forms of hardware, software or combinations thereof. Preferably, these elements are implemented in a combination of hardware and software, which may include using one or more appropriately programmed general-purpose digital computers having a processor and memory and input/output interfaces.

In block 200, a measurement circuit is fabricated. The measurement circuit may be fabricated as an additional processing sequence, but preferably is fabricated concurrently during the steps for fabricating a semiconductor wafer. The measurement circuit may include active or passive circuit elements, which may be activated by the formation of power elements, for example, inductive coils, photodiodes, capacitive coupling or other power elements, which can be activated without the need to contact the semiconductor wafer during testing. Fabrication of the measurement circuit may include forming elements in previous processing steps (lower layers), forming test or dummy elements, or forming elements in a disposable or temporary location, e.g., in the kerf region of a chip.

In block 202, power is coupled to the measurement circuit through a contactless technique, for example, via laser light, capacitive plate (e.g., a conductively patterned mask, an energized coil (RF), etc. In block 204, measurements are taken from the measurement circuit to access the parameters of devices or structures, which are being formed or have been formed during the fabrication process. Measurements may include magnitudes of a particular structure, such as the thickness of a layer (as reflected, e.g., in a capacitance measurement) or measurement the impedance of a passive element say a capacitor or inductor. A plurality of other scenarios is also contemplated, for example, frequency responses or other time or frequency-based information may be collected.

In block 206, responsive to the measurements, steps are taken to correct the structure or component in question. For example, a wafer or chips on a wafer may be rejected at an early phase or fabrication. Alternately, a process parameter may be adjusted, e.g. the thickness of a metal layer, resistivity of a thin film sheet resistor, change in pressure or temperature of the process chamber, etc. The information may also be employed to select a different mask plate or set of mask plates that would effect changes in circuit connectivity. For example if the capacitance of a varactor were deemed to be off center, then the mask that implements the final inductor with which it resonates could be chosen from a selection of different inductances. In this example, mask A could be switched with a mask B to form an inductor of say, 14 nH instead of an inductor of say 10 nH which would have been formed using mask A. This can compensate for elements, which may have been previously formed (e.g., varactor capacitance) or permit customization of the overall response of the circuits, which are being measured. Multiple masks may be available to permit different magnitude resolutions and to permit the selection of larger or smaller magnitude adjustments.

In block 208, the data from the measurements may be fed into a database, and analyzed so that adaptations could be made to either downstream process parameters or to select from one of a set of mask plate combinations that would implement wiring changes that effect the compensation desired. This procedure may be incorporated into the control flow of a fabrication plant with minimal additional cost.

In block 210, processing can continue. In addition, measurements can continue to be made intermittently or continuously using newly formed elements (in later steps) or earlier formed elements to continue to ensure specifications are met.

To illustrate that useful couplings can be obtained using the inductive coupling method mentioned herein, an experiment was conducted using 2 coils of 35 gauge (AWG) enameled magnet wire. The coils were placed on opposite sides of a layer of 3.5 mil thick tape. This configuration is representative of coil diameters that may be used if the coupling coils were deployed in the kerf region.

For this set of coils, self-resonance with the parasitic capacitance of the two turn windings was achieved at about 2.109 GHz with a corrected power transfer efficiency of −0.7 dB. This means that 92% of the power fed to the primary coil was coupled to the secondary and delivered to the load (see e.g., the setup of FIG. 2).

The geometry of the coupling coils can be reduced if it is desired to locate it within the circuit proper. Integrated transformers with 1 nH of self-inductance and coupling coefficients of 60% have been realized in an on-chip fashion. To translate this into a probe membrane-to-circuit coupling separations on the order of several microns would be provided between the probe membrane and the surface of the wafer. This may be achieved by, for example, the use of an air bearing if the probe membrane is perforated and a bleed flow of filtered air is used to control the "flying height" of the membrane as it is brought into proximity of the semiconductor wafer.

Having described preferred embodiments for contactless circuit testing for adaptive wafer processing (which are intended to be illustrative and not limiting), it is noted that modifications and variations can be made by persons skilled in the art in light of the above teachings. It is therefore to be understood that changes may be made in the particular embodiments disclosed which are within the scope and spirit of the invention as outlined by the appended claims. Having thus described aspects of the invention, with the details and particularity required by the patent laws, what is claimed and desired protected by Letters Patent is set forth in the appended claims.

What is claimed is:

1. A system for measuring circuits on an integrated circuit substrate, comprising:
   a semiconductor wafer including a plurality of chips;
   a measurement circuit formed on at least one of the chips, the measurement circuit configured to measure at least one characteristic of a partially fabricated integrated circuit,
   the measurement circuit including a power transfer component which receives energy from a source where the source does not make physical contact with the semiconductor wafer to transfer power to the measurement circuit, the measurement circuit including components that mirror behavior of the partially fabricated integrated circuit so that process parameters are measured for the components to provide information about processing steps and provide information for determining actions to remedy problems prior to completing fabrication of integrated circuits on the wafer; and
   a test device including the source, which delivers energy to the power transfer component of the measurement circuit when in alignment with the power transfer component wherein the test device includes a thin film dielectric membrane having the source mounted thereon.

2. The system as recited in claim 1, wherein the measurement circuit is formed in a kerf area of the chip.

3. The system as recited in claim 1, wherein the power transfer component includes an inductor coil and the source transfers energy via inductive coupling.

4. The system as recited in claim 1, wherein the power transfer component includes a photo sensor and the source transfers energy via light.

5. The system as recited in claim 4, wherein the photo sensor includes a photodiode and the source includes a laser.

6. The system as recited in claim 1, wherein the power transfer component includes a capacitor and the source transfers energy via capacitive coupling.

7. The system as recited in claim 1, wherein the measurement circuit includes a control circuit, which conveys measurement information.

8. The system as recited in claim 1, wherein the test device includes a probe ring.

9. The system as recited in claim 1, wherein the at least one characteristic includes at least one of a layer thickness and a circuit parameter or response.

10. The system as recited in claim 1, wherein the thin film dielectric membrane is transparent so that the source mounted Thereon can be visually aligned to the power transfer component.

* * * * *